(12) United States Patent
Schreck

(10) Patent No.: US 7,126,317 B2
(45) Date of Patent: Oct. 24, 2006

(54) APPARATUS AND METHODS FOR REGULATED VOLTAGE

(75) Inventor: John F Schreck, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/059,135

(22) Filed: Feb. 15, 2005

(65) Prior Publication Data

US 2005/0275390 A1    Dec. 15, 2005

Related U.S. Application Data

(63) Continuation of application No. 10/217,665, filed on Aug. 12, 2002, now Pat. No. 6,861,829.

(51) Int. Cl.
G05F 1/40 (2006.01)
G05F 1/56 (2006.01)
G11C 16/04 (2006.01)

(52) U.S. Cl. .......... 323/282; 323/273; 323/281

(58) Field of Classification Search .......... 323/265, 323/266, 268, 273, 275, 279, 281, 282, 285; 365/185.23, 185.27, 226, 227
See application file for complete search history.

(56) References Cited

U.S. PATENT DOCUMENTS

| 5,847,552 | A | 12/1998 | Brown |
| 5,920,505 | A | 7/1999 | Sali et al. |
| 6,018,236 | A | 1/2000 | Keeth |
| 6,314,028 | B1* | 11/2001 | Kono ............... 365/189.09 |
| 6,441,594 | B1 | 8/2002 | Connell et al. |
| 6,480,436 | B1 | 11/2002 | Confalonieri et al. |
| 6,690,148 | B1 | 2/2004 | Harrison |
| 6,750,642 | B1* | 6/2004 | Murakata et al. ......... 323/323 |
| 6,861,829 | B1 | 3/2005 | Schreck |

* cited by examiner

Primary Examiner—Matthew V. Nguyen
(74) Attorney, Agent, or Firm—Snell & Wilmer L.L.P.

(57) ABSTRACT

An electronic system according to various aspects of the present invention includes a memory and a supply regulation circuit having a regulated output to provide a selected voltage level. In one embodiment, the supply regulation circuit includes a reference voltage circuit connected to the supply and configured to receive a first voltage and a second voltage and provide a reference voltage and a control circuit connected to the reference voltage and configured to control the regulated voltage according to the reference voltage. The supply regulation circuit also includes an adjustment circuit controlled by the control circuit and configured to adjust the regulated voltage according to the reference voltage. The supply regulation circuit may also include a compensator circuit to provide additional adjustment to the regulated voltage.

11 Claims, 4 Drawing Sheets

APPARATUS AND METHODS FOR REGULATED VOLTAGE

CROSS-REFERENCE TO RELATED APPLICATIONS

This application claims priority to application Ser. No. 10/217,665, now U.S. Pat. No. 6,861,829, entitled "Apparatus and Methods for Regulated Voltage," filed Aug. 12, 2002 and is incorporated herein by reference.

FIELD OF THE INVENTION

The present invention generally relates to electronic circuits.

BACKGROUND OF THE INVENTION

Many electronic systems use multiple voltage levels in the same system, and often in the same component. Electronic systems use various voltage levels to drive signals and promote particular operating characteristics for a circuit. For example, a memory chip may require several different voltage levels to operate, such as a main supply voltage, a main supply ground, a bulk voltage, and a negative word line voltage.

Many power supply schemes have been developed for accommodating the different voltage levels. One possible configuration is to minimize the number of voltage levels by using identical voltage levels for different functions. For example, a memory may be configured to use the same voltage level for the bulk voltage $V_{BB}$ and the negative word voltage $V_{NEG}$. Using identical voltage levels for different signals, however, reduces flexibility and tends to inhibit optimal operation.

An alternative solution is to provide a dedicated circuit including a charge pump for each voltage level to provide the requisite power to the system. These systems are relatively expensive, however, for each dedicated circuit in the system requires additional materials, fabrication, testing, chip space, and design. Further, using dedicated circuits for each voltage level adds complexity. For example, the various voltage level supply circuits may require activation in a selected sequence to avoid latchup problems.

SUMMARY OF THE INVENTION

An electronic system according to various aspects of the present invention includes memory and a supply regulation circuit having a regulated output to provide a selected voltage level. In one embodiment, the supply regulation circuit includes a reference voltage circuit configured to provide a reference voltage. The supply regulation circuit also includes a control circuit connected to the reference voltage and configured to control the regulated voltage according to the reference voltage. In addition, the supply regulation circuit includes an adjustment circuit controlled by the control circuit and configured to adjust the regulated voltage according to the reference voltage. The supply regulation circuit may also include a compensator circuit to provide additional adjustment or maintenance to the regulated voltage.

BRIEF DESCRIPTION OF THE DRAWING

Aspects of the present invention are disclosed in the non-limiting embodiments described in the specification and the claims, in conjunction with the accompanying figures, wherein like numerals designate like elements:

Elements in the figures are illustrated for simplicity and clarity and have not necessarily been drawn to scale. For example, the dimensions of some of the elements in the figures may be exaggerated relative to other elements to improve understanding of the embodiments of the present invention.

DETAILED DESCRIPTION OF EXEMPLARY EMBODIMENTS

Various aspects and features of the present invention may be described in terms of functional components and steps. Such functional components and steps may be realized by any number of elements and/or steps configured to perform the specified functions. For example, the present methods and apparatus may employ electronic, signaling, and logic elements, like impedances, transistors, operational amplifiers, voltage supplies, and current sources, which may carry out a variety of functions in various embodiments, applications, and environments. In addition, the present methods and apparatus may be practiced in conjunction with any number of procedures and systems, and the apparatus and methods described are merely exemplary applications for the invention. Further, the methods and apparatus may employ any appropriate techniques, conventional or otherwise, for placement, use, manufacturing, and the like.

Figure 1:
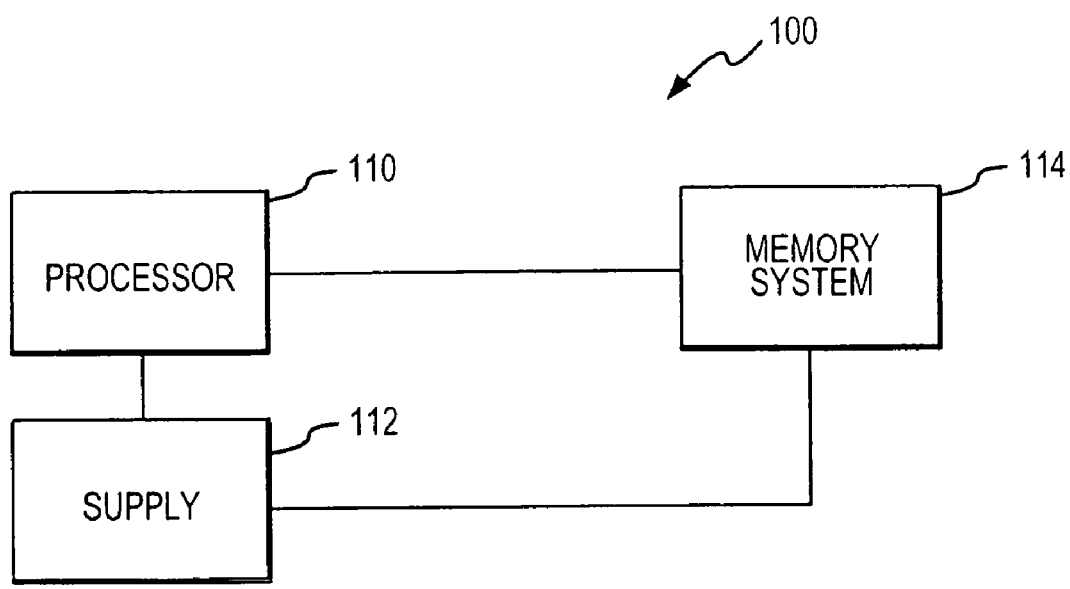
FIG. 1 is a block diagram of an electronic system according to various aspects of the present invention.

An electronic system according to various aspects of the present invention includes a plurality of components operating in conjunction with a supply regulation circuit. The components may comprise any components using a supply regulation circuit, such as multiple integrated circuits and electrical components on a single board, various elements in a single integrated circuit, various components of a computer system, or any other components. For example, referring to FIG. 1, an exemplary electronic system 100 suitably comprises a computer having a processor 110, a supply 112, and a memory system 114. The processor 110 controls the electronic system 100, such as in accordance with a program. The processor 110 may comprise any controlling element, for example a conventional central processing unit, such as an Intel Pentium processor or an Advanced Micro Devices Athlon processor.

The supply 112 provides power to the various components of the electronic system 100, including the processor 110 and the memory system 114. The supply 112 may comprise any source of power for the electronic system 100, such as a conventional electric power supply, a charge pump, and/or other power supplies. In the present embodiment, the supply 112 is connected to the processor 110 and is configured to supply at least two voltage levels. Although the present embodiment includes the processor 110, the supply 112, and the memory system 114, the electronic system 100 may include any suitable components.

Figure 2:
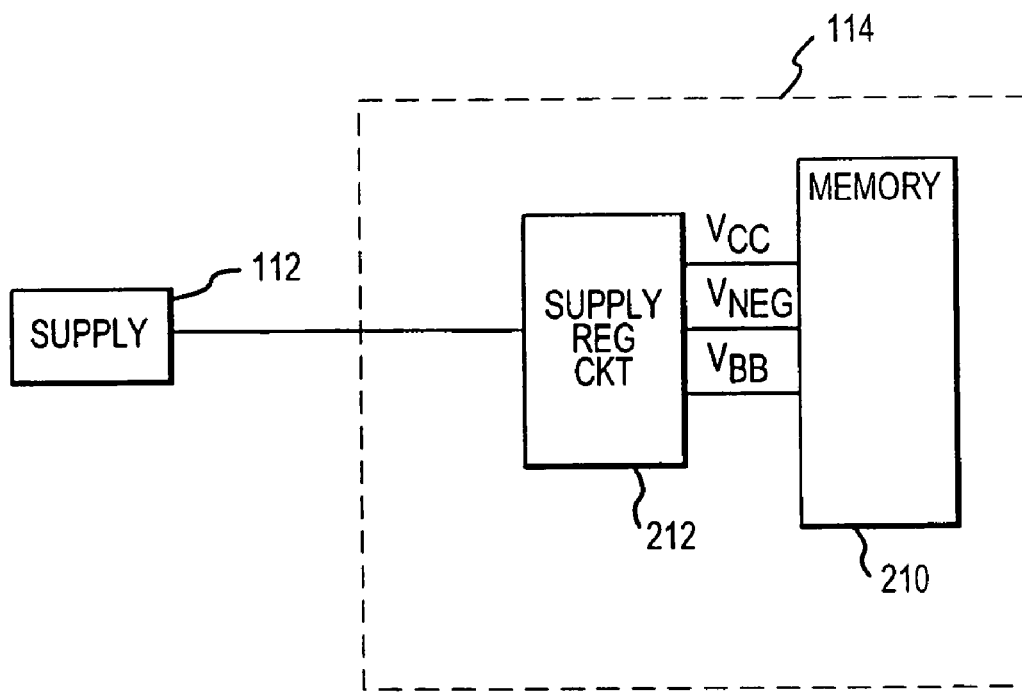
FIG. 2 is a block diagram of an exemplary supply and a memory system.

The memory system 114 stores information for subsequent retrieval. The memory system 114 may comprise any appropriate memory, memory system, or storage device or system. The memory system 114 may comprise, be replaced by, or be supplemented by any component or system drawing power from the supply 112. The memory system 114 is suitably connected to the processor 110 and configured to provide information to the processor 110. For example, referring to FIG. 2, the memory system 114 of the present embodiment suitably comprises a memory 210 and a supply regulation circuit 212. The memory 210 comprises any suitable system for storing data for later retrieval, such as a memory subsystem including a memory controller, multiple memory chips, and associated logic and circuitry. In the present embodiment, the memory 210 comprises an SDRAM, such as an SDRAM available from Micron Technology, Inc. The memory 210 suitably includes multiple word lines and bit lines used to store information at selected addresses in the memory 210.

The supply regulation circuit 212 controls the supply levels to one or more components of the electronic system 100, such as the memory 210. In the present embodiment, the supply regulation circuit 212 is integrated into the memory 210, though the supply regulation circuit 212 may be integrated into other components of the memory 210 or implemented as a separate circuit. The supply regulation circuit 212 according to various aspects of the present invention provides selected voltage levels to the memory 210. In particular, the supply regulation circuit 212 is connected to the supply 112 to receive power and may be configured to generate, monitor, and regulate one or more particular voltages for the memory 210. The supply regulation circuit 212 may comprise any suitable supply regulation circuit, such as a voltage control circuit, current control circuit, or any other supply regulation circuit or suitable combination of circuits.

Figure 3:
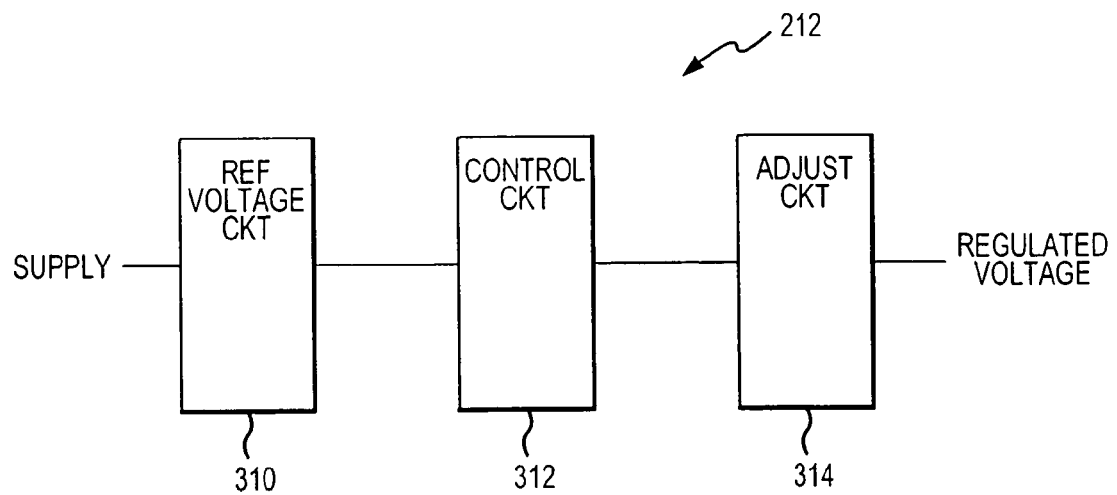
FIG. 3 is a block diagram of an exemplary supply regulation circuit.

In the present embodiment, the supply regulation circuit 212 is configured to generate a negative word line voltage $V_{NEG}$ to supply a negative signal to one or more word lines of the memory 210. The supply regulation circuit 212 may be configured in any suitable manner to provide the negative word line voltage $V_{NEG}$. The supply regulation circuit 212 may be configured to provide and regulate selected voltages and/or currents according to any criteria and in any suitable manner. For example, referring to FIG. 3, a supply regulation circuit 212 according to various aspects of the present invention is configured to selectively provide at least one regulated voltage and/or current to the word lines of the memory 210. The supply regulation circuit 212 suitably comprises a reference voltage circuit 310; a control circuit 312; and an adjustment circuit 314. The reference voltage circuit 310 is suitably connected to the supply 112 and configured to provide a control reference voltage. The control circuit 312 is suitably connected to the reference voltage circuit 310 and configured to control the regulated voltage according to the control reference voltage. Further, the adjustment circuit 314 is suitably controlled by the control circuit 312 and configured to adjust the regulated voltage according to the signals received from the control circuit.

Figure 4:
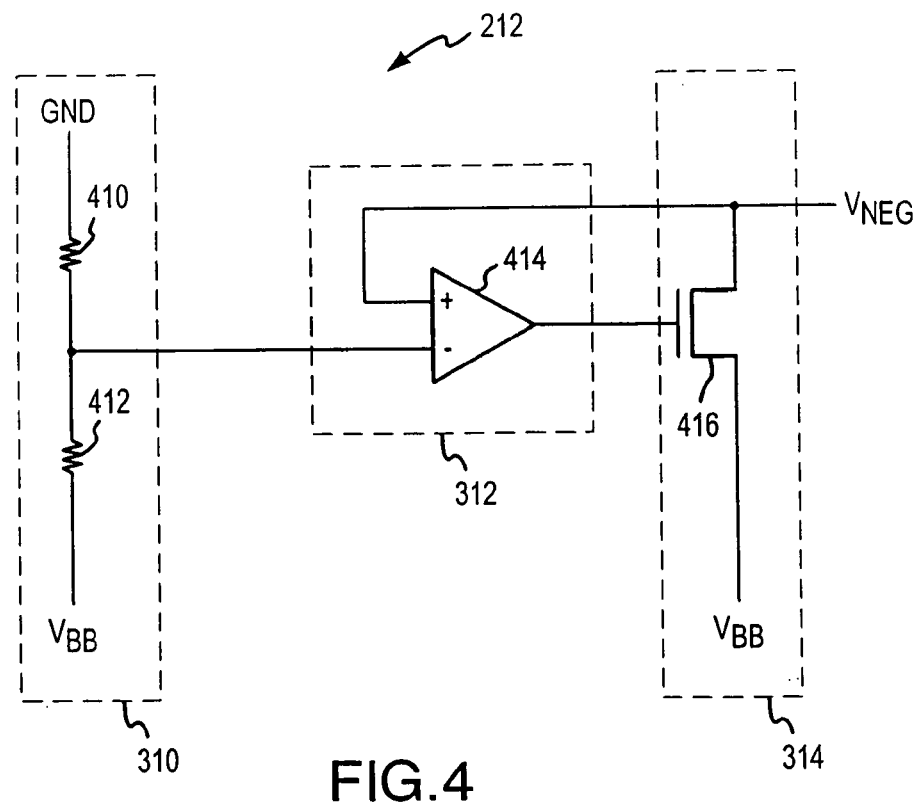
FIG. 4 is a schematic diagram of an exemplary supply regulation circuit.

More particularly, the reference voltage circuit 310 generates one or more control reference voltages, such as a control reference voltage for the negative word line voltage $V_{NEG}$. In the present embodiment, the control reference voltage may comprise any suitable voltage or other signal to be used as a target voltage by another component. The reference voltage circuit 310 may be configured in any suitable manner to generate the control reference voltages. For example, referring to FIG. 4, the reference voltage circuit 310 is connected to a first voltage and a second voltage to generate the control reference voltage between the first and second voltages. The reference voltage circuit 310 suitably comprises a voltage divider circuit having a first terminal connected to, for example, a main ground $V_{SS}$ from the supply 112 and a second terminal connected to, for example, a bulk voltage $V_{BB}$, also suitably generated by the supply 112. At least two impedances 410, 412 form the voltage divider. In the present embodiment, the impedances 410, 412 comprise conventional resistors. Alternatively, the impedances 410, 412 may comprise variable resistors, resistive-capacitive elements, transistors, or any other appropriate elements for generating the desired control reference voltage. Further, the first and second voltages may be any appropriate voltages or other signals from which the control reference voltage may be derived.

Figure 5:
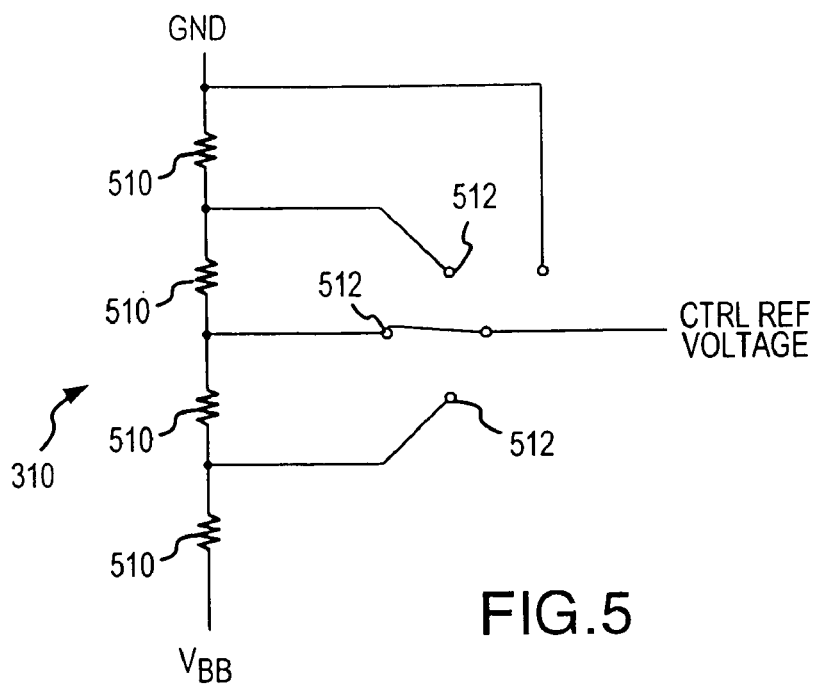
FIG. 5 is a schematic diagram of an exemplary reference voltage circuit.

In another embodiment, the reference voltage circuit 310 may be configured to generate multiple control reference voltages. For example, referring to FIG. 5, a voltage divider may be configured having multiple impedances 510 and multiple taps 512 to generate multiple control reference voltages. The multiple control reference voltages, however, may be generated by any suitable system for generating multiple reference voltages. Any number of control reference voltages may be generated for use by the memory 210 and/or other components of the electronic system 100. Further, the reference voltage circuit 310 may be configured in any suitable manner to connect the regulated voltage to ground or another potential, for example in response to a test mode that may require discharging a relatively large load from the memory 210.

In addition, the reference voltage circuit 310 may include a buffer, for example between the supply 112 and one or more of the supply terminals of the reference voltage circuit 310. The buffer may be included or omitted according to the configuration of the supply regulation circuit 212. For example, if the supply 112 comprises a high impedance node, the buffer may be included to provide a lower impedance source for the supply voltage.

The control circuit 312 controls the regulated voltage according to the control reference voltage. In one embodiment, the control circuit 312 compares the regulated voltage to at least one of the control reference voltages. The control circuit 312 also suitably controls the adjustment circuit 314, for example by generating a control signal provided to the adjustment circuit 314.

The control circuit 312 may comprise any suitable circuit for controlling the adjustment circuit or providing the regulated voltage according to the control reference voltage circuit. Referring again to FIG. 4, the control circuit 312 of the present embodiment comprises a differential amplifier 414 having an inverting input connected to the control reference voltage and a noninverting input connected to the regulated voltage. The differential amplifier 414 generates the control signal, such as a differential signal proportional to the difference between the control reference voltage and the regulated voltage, which is suitably provided to the adjustment circuit 314.

Figure 8:
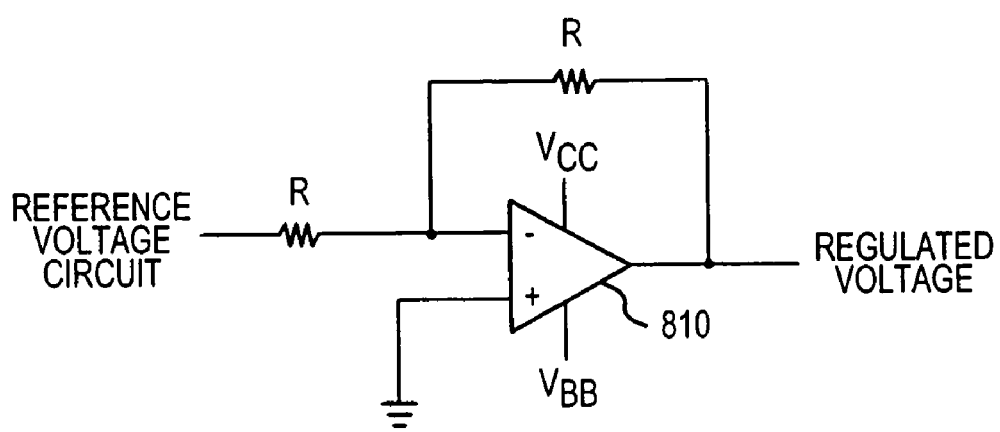
FIG. 8 is a schematic diagram of an exemplary integrated control circuit and adjustment circuit.

Referring to FIG. 8, an alternative embodiment of a control circuit 312 provides the regulated voltage directly with an integrated adjustment circuit 314. The control circuit 312 provides a signal at the level of the control reference voltage to maintain the output voltage at the level designated by the control reference voltage. For example, the control circuit 312 suitably comprises a substantially unity (either inverting or noninverting) gain amplifier, to drive the adjustment circuit 314. In the present embodiment, the control circuit 312 is implemented as an inverting operational amplifier having a gain of approximately 1 or −1. In particular, the operational amplifier has a noninverting input connected to ground and an inverting input connected to the reference voltage circuit 310 via an input resistor. The inverting input is also connected to the output of the operational amplifier via a feedback resistor having a substantially identical resistance as the input resistor.

The adjustment circuit 314 is controlled by the control circuit 312 and is configured to generate the regulated voltage using another voltage and adjust the regulated voltage according to the control signal. The adjustment circuit 314 may be configured in any suitable manner to generate the regulated voltage and adjust the regulated voltage according to the control reference voltage. For example, referring again to FIG. 4, the adjustment circuit 314 suitably comprises an adjustable impedance, such as an n-channel insulated gate transistor 416. If appropriate, the transistor 416 may be supplementally implanted to raise its threshold voltage such that the transistor 416 is off when the gate voltage is at the lowest voltage supplied by the control circuit, such as ground $V_{SS}$. The transistor 416 has a control terminal for adjusting the impedance of the transistor, such as a gate, connected to the control circuit 312 to receive the control signal. A supply terminal, such as the drain of the transistor 416, is connected to a supply voltage from which the word line supply voltage $V_{NEG}$ is drawn, such as the bulk voltage $V_{BB}$. The regulated voltage is suitably provided at the source of the transistor 416. In the present embodiment, the negative word line voltage $V_{NEG}$ voltage level is selectively connected to the word lines of the memory 210. The adjustment circuit 314 may thus adjust the regulated voltage $V_{NEG}$ by varying the impedance of the transistor 416.

In the alternative embodiment, the adjustment circuit 314 may be omitted or integrated into an amplifier 810 (FIG. 8). The amplifier 810 is suitably configured to automatically compensate for changes in current or voltage at its output to maintain a substantially constant voltage. The adjustment circuit 314 is integrated into the amplifier 810. Accordingly, the output of the amplifier 810 may be used as the output $V_{NEG}$ of the supply regulation circuit 212.

In operation, the negative word line voltage $V_{NEG}$ is selectively connected to one or more word lines of the memory 210. Consequently, the voltage applied to the negative word line voltage $V_{NEG}$ varies as charged word lines are connected to the negative word line voltage $V_{NEG}$ following memory 210 accesses. As the negative word line voltage $V_{NEG}$ changes, the control circuit 312 compares the current negative word line voltage $V_{NEG}$ to the control reference voltage. If the current negative word line voltage $V_{NEG}$ is too high, the control circuit 312 adjusts the control signal, for example to reduce the impedance of the transistor 416. In particular, the differential amplifier 414 generates a differential signal having an amplitude corresponding to the magnitude of the difference between the control reference voltage and the negative word line voltage $V_{NEG}$. The differential signal is provided to the transistor 416 of the adjustment circuit 314, which reduces the impedance of the transistor 416. As a result, the negative word line voltage $V_{NEG}$ is pulled lower towards the bulk voltage $V_{BB}$, thus returning the negative word line voltage $V_{NEG}$ to the proper voltage level. Similarly, if the negative word line voltage $V_{NEG}$ is too low, the control circuit 312 adjusts the control signal to increase the impedance of the transistor 416. The adjustable impedance of the transistor 416 tends to drive the negative word line voltage $V_{NEG}$ towards the control reference voltage, thus maintaining the desired regulated voltage for, for example, the negative word line voltage or other desired signal. In embodiments having omitted or integrated adjustment circuits 314, the control circuit 312 adjusts the output signal of the control circuit 312 to maintain the desired voltage according to the control reference voltage.

Thus, a supply regulation circuit 212 according to the present embodiment provides a negative word line voltage $V_{NEG}$ by maintaining a signal between the bulk voltage $V_{BB}$ and ground. The bulk voltage $V_{BB}$ supply provides all of the required current. The adjustment circuit 314 facilitates siphoning any required current from the bulk voltage $V_{BB}$ supply. Consequently, a single pump of adequate capacity may supply both the bulk voltage $V_{BB}$ and the negative word line voltage $V_{NEG}$. In this embodiment, if either load connected to the bulk voltage $V_{BB}$ and the negative word voltage $V_{NEG}$ exceeds normal operating conditions, the single pump can supply the necessary power. Further, the supply regulation circuit 212 according to the present embodiment prevents the negative word voltage $V_{NEG}$ from becoming more negative than the bulk voltage $V_{BB}$, which might otherwise lead to a latchup problem.

A supply regulation circuit according to various aspects of the present invention may also comprise a compensator circuit to compensate for any extra current or other operational requirement of the regulated voltage. For example, the compensator circuit may be connected to the negative word voltage $V_{NEG}$ to compensate for leakage current in the transistor 416. The compensator circuit may be configured in any suitable manner to compensate for the leakage current.

Figure 6:
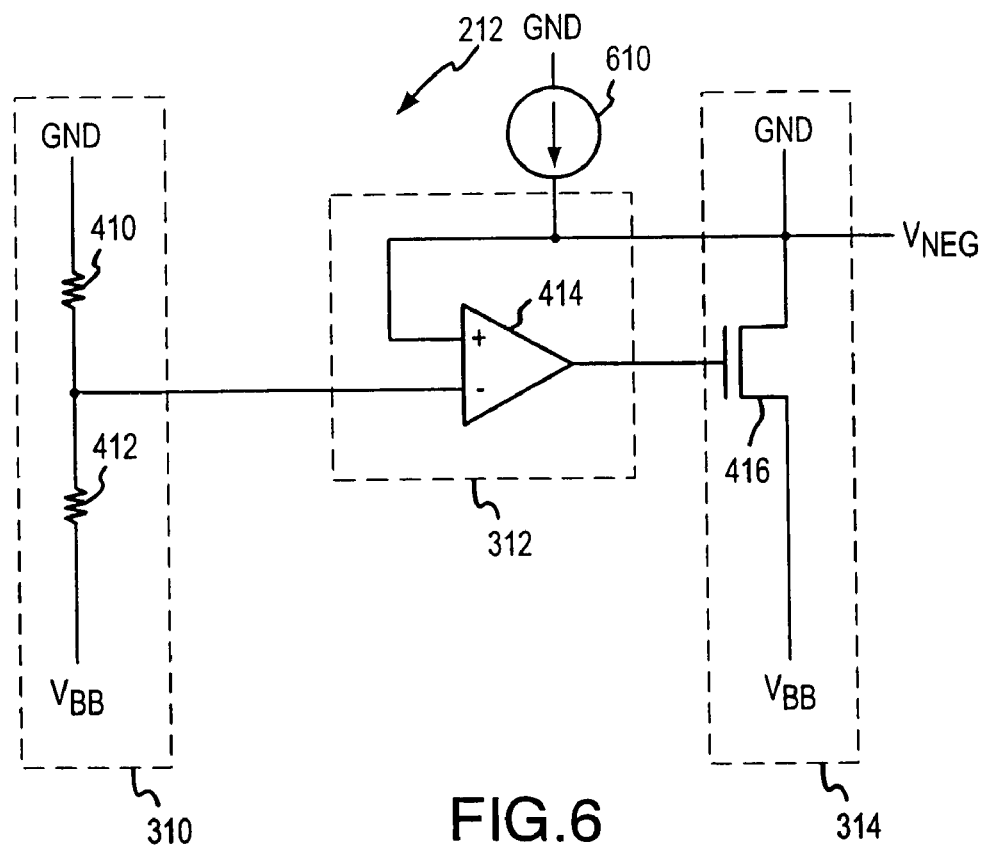
FIG. 6 is a schematic diagram of an exemplary supply regulation circuit having a compensation circuit including a current source.

For example, referring to FIG. 6, the compensator circuit may include a current source 610 connected to the source of the transistor 416. The current source 610 may provide a relatively low current to the regulated voltage to compensate for current lost as leakage or stand-by current. In the present embodiment, the current source 610 inhibits the negative word voltage $V_{NEG}$ from becoming more negative than the control reference voltage. The current source 610 may be implemented in any suitable manner, such as using a conventional current mirror circuit to maintain a desired current through the transistor 416.

Figure 7:
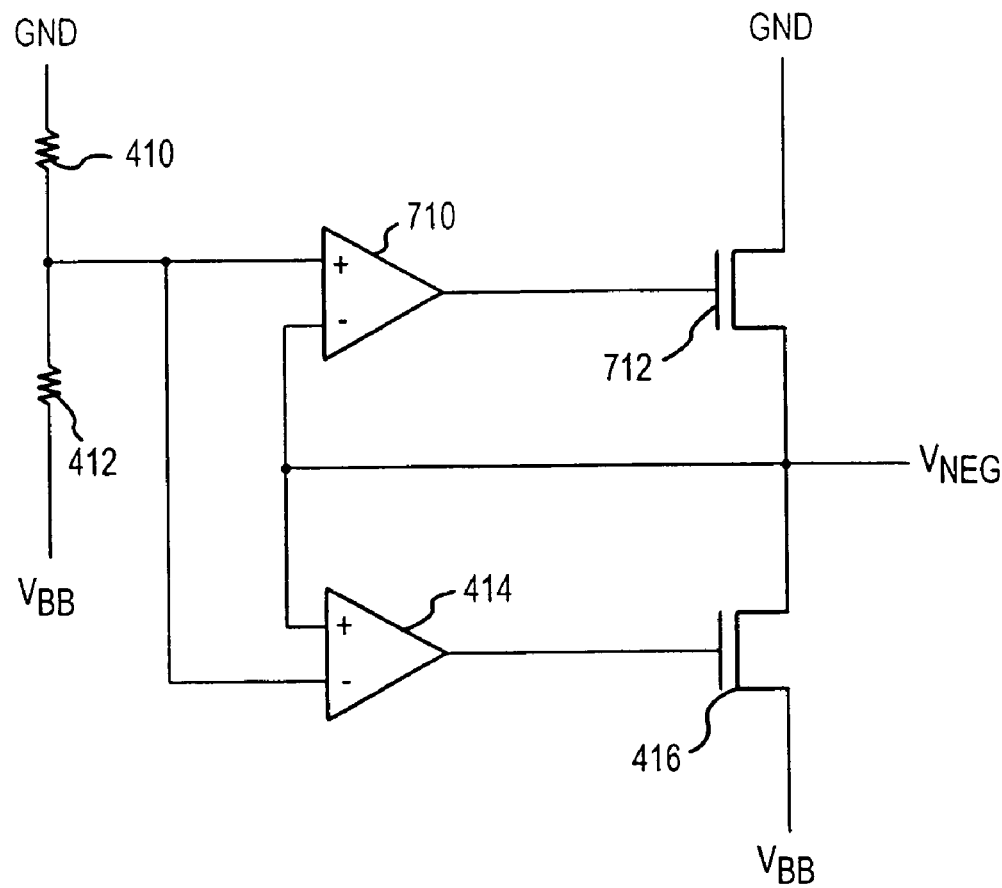
FIG. 7 is a schematic diagram of an exemplary supply regulation circuit having a compensation circuit including a second differential amplifier and an adjustable impedance.

In an alternative embodiment, the compensator circuit may be configured to compare the regulated voltage to the reference voltage and compensate if the regulated voltage is too low. For example, referring to FIG. 7, an alternative compensator circuit according to various aspects of the present invention suitably comprises a second differential amplifier 710 and a second transistor 712. The second differential amplifier 710 has a noninverting input connected to the control reference voltage and an inverting input connected to the negative word line voltage $V_{NEG}$. Like the first differential amplifier 414, the second differential amplifier 710 generates a differential signal proportional to the difference between the control reference voltage and the negative word line voltage $V_{NEG}$, which is suitably provided to a second impedance, such as the n-channel transistor 712.

The second transistor 712 is suitably configured to modulate the impedance between a more positive voltage level, such as ground, and the negative word line voltage $V_{NEG}$ according to the second differential signal generated by the second differential amplifier 710. In the present embodiment, the gate of the second transistor 712 is connected to the second differential output, and the source and drain of the second transistor 712 are suitably connected to ground and the source of the first transistor 416, respectively. The second transistor 712 may be configured to exhibit additional resistance or may be connected to an additional resistor to increase the resistance of the compensation circuit. The negative word line voltage $V_{NEG}$ is provided at the node between the first impedance 416 and the second impedance 712. Thus, the first differential amplifier and transistor pair 414, 416 tends to pull the negative word line voltage $V_{NEG}$ to the control reference voltage if the negative word line voltage is too high, and the second differential amplifier and transistor pair 710, 712 tends to pull the negative word line voltage $V_{NEG}$ to the control reference voltage if the regulated voltage is too low.

The present invention is described with reference to various preferred embodiments. However, changes and modifications may be made to various exemplary embodiments without departing from the scope of the present invention. These and other changes or modifications are intended to be included within the scope of the present invention as set forth in the appended claims.

The invention claimed is:

1. A word line voltage supply for a memory using a word line voltage and a supply voltage, the word line voltage supply configured for operation in a processor based electronic system with a supply connected to the processor and configured to provide a first voltage and a second voltage, wherein the word line voltage supply comprises:
   a reference voltage circuit configured to provide a control reference voltage;
   a control circuit connected to the control reference voltage and configured to provide a control signal according to the control reference voltage; and
   an adjustment circuit controlled by the control signal connected to a power source and configured to:
      receive the first voltage and the second voltage;
      generate a regulated voltage from at least one of the first voltage and the second voltage; and
      adjust the regulated voltage according to the control signal.

2. A word line supply according to claim 1, wherein the power source is a bulk voltage for a memory.

3. A word line supply according to claim 1, wherein the control circuit comprises a differential amplifier responsive to the control reference voltage and the word line voltage.

4. A word line supply according to claim 1, wherein the control circuit comprises an amplifier with a gain of approximately unity.

5. A word line supply according to claim 1, wherein the adjustment circuit comprises an adjustable impedance, and wherein the word line voltage corresponds to the adjustable impedance.

6. A word line supply according to claim 5, wherein the adjustable impedance comprises a transistor having a first terminal connected to the word line voltage, a second terminal connected to the power source, and a control terminal responsive to the control reference voltage.

7. A word line supply according to claim 1, further comprising a compensator circuit connected to the adjustment circuit and configured to provide a supplemental power supply to the adjustment circuit.

8. A method of providing a word line voltage to a memory used in an electronic system, comprising:
   providing an electronic system with a processor;
   providing a supply connected to the processor for providing a first voltage and a second voltage;
   providing a memory;
   providing an adjustment circuit controlled by a control signal connected to a power source;
   providing a first voltage and a second voltage to the adjustment circuit;
   generating a regulated voltage from at least one of the first voltage and the second voltage; and
   adjusting the regulated voltage according to the control signal.

9. A word line voltage supply for a memory using a word line voltage and a supply voltage, the word line voltage supply configured for operation in an electronic system with a supply that provides a first voltage and a second voltage, wherein the word line voltage supply comprises:
   a power source configured to generate the supply voltage;
   a reference voltage circuit for generating a control reference voltage;
   a control circuit connected to the control reference voltage and configured to provide a control signal according to the control reference voltage; and
   an adjustment circuit controlled by the control signal connected to the power source and configured to:
      receive the first voltage and the second voltage;
      generate a regulated voltage from at least one of the first voltage and the second voltage; and
      adjust the regulated voltage according to the control signal.

10. A word line voltage supply according to claim 9, wherein the control circuit comprises an amplifier with a gain of approximately unity.

11. An electronic system comprising:
   a processor;
   a supply connected to the processor and configured to provide a first voltage and a second voltage;
   a memory; and
   a word line voltage supply for the memory using a word line voltage and a supply voltage comprising,
      a control circuit configured to receive a control reference voltage and configured to provide a control signal according to the control reference voltage; and
      an adjustment circuit controlled by the control signal that is configured to:
         receive the first voltage and the second voltage;
         generate a regulated voltage from at least one of the first voltage and the second voltage; and
         adjust the regulated voltage according to the control signal.

* * * * *